United States Patent
Choi et al.

(10) Patent No.: US 9,184,418 B2
(45) Date of Patent: Nov. 10, 2015

(54) ORGANIC LIGHT EMITTING DIODE (OLED) DISPLAY AND METHOD OF MANUFACTURING THE SAME

(71) Applicant: Samsung Display Co., Ltd., Yongin, Gyeonggi-do (KR)

(72) Inventors: Man Seob Choi, Hwaseong-si (KR); Jae Ik Lim, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/029,675

(22) Filed: Sep. 17, 2013

(65) Prior Publication Data

US 2014/0175399 A1    Jun. 26, 2014

(30) Foreign Application Priority Data

Dec. 26, 2012 (KR) .................. 10-2012-0153449

(51) Int. Cl.
*H01L 51/05* (2006.01)
*H01L 51/56* (2006.01)
*H01L 27/32* (2006.01)

(52) U.S. Cl.
CPC .............. *H01L 51/56* (2013.01); *H01L 27/322* (2013.01)

(58) Field of Classification Search
CPC ............ H01L 51/0545; H01L 51/0036; H01L 51/0541; H01L 51/5012; B82Y 10/00
USPC .......................................... 257/40; 438/82, 99
See application file for complete search history.

(56) References Cited

U.S. PATENT DOCUMENTS

| | | | |
|---|---|---|---|
| 2001/0052953 A1* | 12/2001 | Tanaka ............................ | 349/43 |
| 2005/0274968 A1* | 12/2005 | Kuo et al. ........................ | 257/98 |
| 2007/0090350 A1* | 4/2007 | Lee et al. ......................... | 257/40 |
| 2008/0122347 A1 | 5/2008 | Lee | |
| 2009/0033217 A1* | 2/2009 | Teng et al. ..................... | 313/504 |
| 2009/0206733 A1* | 8/2009 | Hwang et al. .................. | 313/504 |

FOREIGN PATENT DOCUMENTS

| KR | 10-2004-0044353 A | 5/2004 |
|---|---|---|
| KR | 10-2009-0089151 A | 8/2009 |

* cited by examiner

*Primary Examiner* — Steven Loke
*Assistant Examiner* — Didarul Mazumder
(74) *Attorney, Agent, or Firm* — Knobbe, Martens, Olson & Bear, LLP

(57) ABSTRACT

An organic light emitting diode (OLED) display is disclosed. In one aspect, the display includes a substrate having a plurality of pixel areas, color filters respectively disposed in the pixel areas, a passivation layer disposed on the color filters, a first electrode disposed on the passivation layer. The display also includes a light emitting layer disposed on the first electrode and a second electrode disposed on the light emitting layer. At least a portion of the color filters is provided with a concavo-convex pattern formed on an upper surface thereof.

20 Claims, 8 Drawing Sheets

ORGANIC LIGHT EMITTING DIODE (OLED) DISPLAY AND METHOD OF MANUFACTURING THE SAME

CROSS-REFERENCE TO RELATED APPLICATION

This U.S. non-provisional patent application claims priority under 35 U.S.C. §119 of Korean Patent Application No. 10-2012-0153449, filed on Dec. 26, 2012, the contents of which are hereby incorporated by reference in their entirety.

BACKGROUND

1. Field of Disclosure

The present disclosure generally relates to an organic light emitting diode (OLED) display and a method of manufacturing the same.

2. Description of the Related Technology

A flat-panel display is generally classified into a light-emitting type and a light-receiving type. As the light-emitting type, a flat cathode ray tube, a plasma display panel, and an electroluminescent device have been used, and as the light-receiving type, a liquid crystal display has been used. Among them, the electroluminescent device has been spotlighted as a next-generation display since the electroluminescent device has advantages, such as a wide viewing angle, a superior contrast ratio, a fast response speed, etc. The electroluminescent device is classified into an inorganic electroluminescent device and an organic electroluminescent device according to a material forming a light emitting layer.

The organic electroluminescent device is a self-emissive type display that emits light by electrically exciting fluorescent organic compound. The organic electroluminescent device has various advantages, e.g., a low driving voltage, slimness, a wide viewing angle, a fast response speed, etc.

The organic electroluminescent device includes an anode electrode, a cathode electrode, and a light emitting layer formed of an organic material and disposed between the anode electrode and the cathode electrode. The organic electroluminescent device respectively applies positive and negative voltages to the anode and cathode electrodes, and thus holes injected from the anode electrode are transported to the light emitting layer through a hole transport layer and electrons injected from the cathode electrode are transported to the light emitting layer through an electron transport layer. The holes are recombined with the electrons in the light emitting layer to generate excitons. The excitons emit energy, which is discharged when an excited state returns thereof to a ground state, as light.

SUMMARY

One inventive aspect is an OLED display having a high lateral brightness and an improved color difference.

Another aspect is a method of manufacturing the OLED display.

Another aspect is an OLED display including a substrate that includes a plurality of pixel areas, color filters respectively disposed in the pixel areas, a passivation layer disposed on the color filters, a first electrode disposed on the passivation layer, a light emitting layer disposed on the first electrode, and a second electrode disposed on the light emitting layer. At least a portion of the color filters comprises a concavo-convex pattern formed thereon.

The color filters include a first color filter, a second color filter, and a third color filter, which display different colors from each other, and the concavo-convex pattern is disposed on at least one of the first, second, and third color filters.

The first color filter, the second color filter, and the third color filter display a blue color, a green color, and a red color, respectively, and the concavo-convex pattern is provided in a protrusion or a recess.

The concavo-convex pattern is disposed on an upper surface of the first color filter, and the concavo-convex pattern is further disposed on at least one upper surface of the second color filter and the third color filter. A height of the protrusion or a depth of the recess becomes different according to the red, green, and blue colors, and the height of the protrusion or the depth of the recess gradually decreases in an order of the first color filter, the second color filter, and the third color filter. A contact angle between an upper surface of the substrate and the protrusion decreases in an order of the first color filter, the second color filter, and the third color filter. The protrusion or the recess is provided in a plural number, and the protrusions or the recesses have a different density according to the red, green, and blue colors.

Each color filter has a refractive index different from a refractive index of the passivation layer. The refractive index of each color filter is equal to or greater than about 1.4, and the refractive index of the passivation layer is equal to or smaller than about 1.2. According to embodiment, the refractive index of each color filter is equal to or smaller than 1.6 and the refractive index of the passivation layer is equal to or greater than about 1.8. According to embodiment, the refractive index of each color filter is about 1.5 and the refractive index of the passivation layer is about 1.8.

Another aspect is a method of manufacturing an OLED display, the method including: forming color filters, each provided with a concavo-convex pattern formed at least a portion of an upper surface thereof, on a substrate, forming a passivation layer on the color filters, forming a first electrode on the passivation layer, forming a light emitting layer on the first electrode, and forming a second electrode on the light emitting layer.

The color filters include a first color filter, a second color filter, and a third color filter, which display different colors, and the concavo-convex pattern is disposed on at least one of the first, second, and third color filters.

Each color filter is formed by forming a photoresist on the substrate to correspond to each color, exposing the photoresist to a light using a half-tone mask or a slit mask, and developing the exposed photoresist.

DETAILED DESCRIPTION

Figure 1:
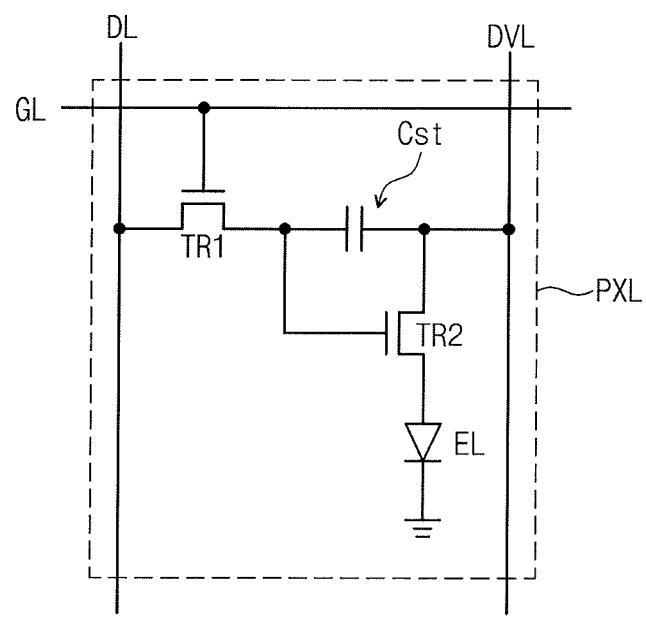
FIG. 1 is a circuit diagram showing an OLED display according to an exemplary embodiment.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be explained in detail with reference to the accompanying drawings.

Figure 2:
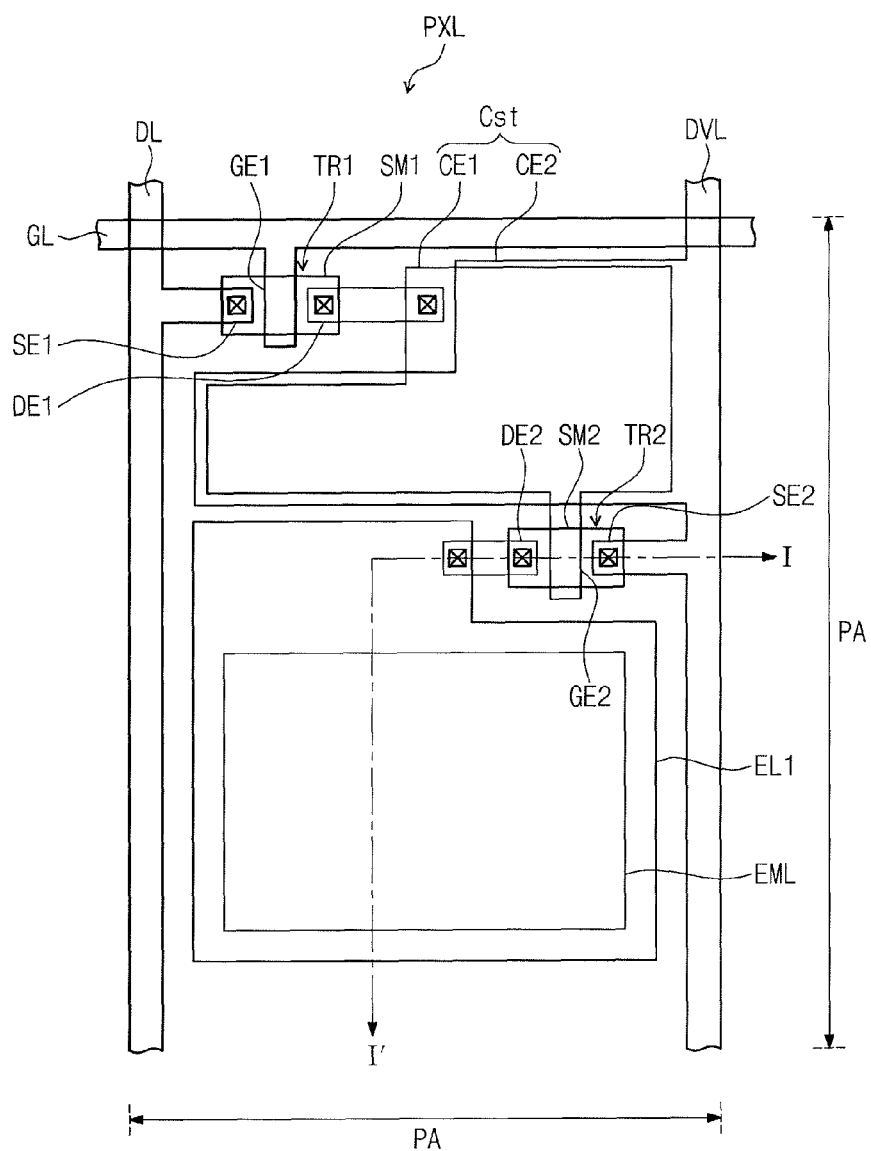
FIG. 2 is a plan view showing a pixel shown in FIG. 1.
Figure 3:
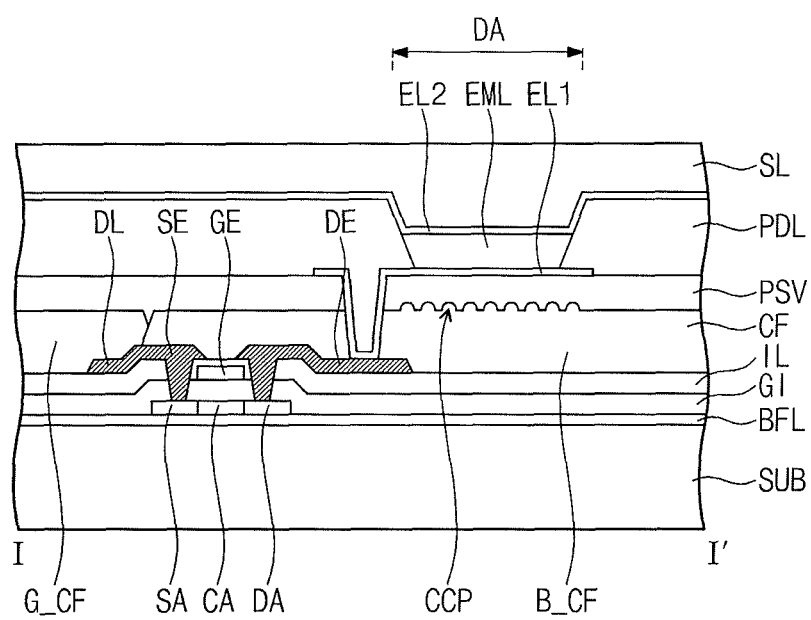
FIG. 3 is a cross-sectional view taken along a line I-I' of FIG. 2.

FIG. 1 is a circuit diagram showing an OLED display according to an exemplary embodiment, FIG. 2 is a plan view showing a pixel of FIG. 1, and FIG. 3 is a cross-sectional view taken along a line I-I' of FIG. 2.

An OLED display generally includes at least one pixel PXL on which an image is displayed. The pixel PXL is provided in a pixel area PA. The pixel PXL is provided in a plural number and the pixels PXL are arranged in a matrix configuration, however, for the convenience of explanation, only one pixel PXL will be shown in the present embodiment. Each pixel PXL has a rectangular shape, but it should not be limited thereto or thereby. That is, the pixel PXL may have various shapes. Also, the pixels PXL may have different areas from each other.

The pixel PXL includes a wiring part having a gate line GL, a data line DL, and a driving voltage line DVL, a thin film transistor connected to the wiring part, an organic light emitting device EL connected to the thin film transistor, and a capacitor Cst.

The gate line GL is extended in one direction. The data line DL is extended in another direction crossing the gate line GL. The driving voltage line DVL is extended in a direction substantially in parallel to the data line DL. The gate line GL applies a scan signal to the thin film transistor, the data line DL applies a data signal to the thin film transistor, and the driving voltage line DVL applies a driving voltage to the thin film transistor.

The thin film transistor includes a driving thin film transistor TR2 to control the organic light emitting device EL and a switching thin film transistor TR1 to switch the driving thin film transistor TR2. In the present exemplary embodiment, one pixel PXL includes two thin film transistors TR1 and TR2, but the number of the thin film transistors should not be limited to two. That is, one pixel PXL may include one thin film transistor and one capacitor, or three or more thin film transistors and two or more capacitors.

The switching thin film transistor TR1 includes a first gate electrode GE1, a first source electrode SE1, and a first drain electrode DE1. The first gate electrode GE1 is connected to the gate line GL and the first source electrode SE1 is connected to the data line DL. The first drain electrode DE1 is connected to a gate electrode, i.e., a second gate electrode GE2, of the driving thin film transistor TR2. The switching thin film transistor TR1 transmits the data signal applied to the data line DL to the driving thin film transistor TR2 in response to the scan signal applied to the gate line GL.

The driving thin film transistor TR2 includes the second gate electrode GE2, a second source electrode SE2, and a second drain electrode DE2. The second gate electrode GE2 is connected to the switching thin film transistor TR1, the second source electrode SE2 is connected to the driving voltage line DVL, and the second drain electrode DE2 is connected to the organic light emitting device EL.

The organic light emitting device EL includes a light emitting layer EML, a first electrode EL1, and a second electrode EL2 facing the first electrode EL1 while interposing the light emitting layer EML between the first and second electrodes EL1 and EL2. The first electrode EL1 is connected to the second drain electrode DE2 of the driving thin film transistor TR2. The second electrode EL2 receives a common voltage, and the light emitting layer EML emits a light in response to an output signal output from the driving thin film transistor TR2, to thereby display an image.

The capacitor Cst is connected between the second gate electrode GE2 and the second source electrode SE2 of the driving thin film transistor TR2 and charged with the data signal applied to the second gate electrode GE2 of the driving thin film transistor TR2 to maintain the data signal applied to the second gate electrode GE2.

A substrate SUB includes the pixel areas PA to which the pixels PXL are provided. The substrate SUB may be, but not limited to, an insulating substrate formed of glass, plastic, crystal, etc.

A buffer layer BFL is disposed on the substrate SUB. The buffer layer BFL prevents impurities from being diffused into the switching thin film transistor TR1 and the driving thin film transistor TR2. The buffer layer BFL may be formed of silicon nitride (SiNx), silicon oxide (SiOx), or silicon oxynitride (SiOxNy), and the buffer layer BFL may be omitted according to the material and the process condition of the substrate SUB.

A first semiconductor layer SM1 and a second semiconductor layer SM2 are provided on the buffer layer BFL. The first semiconductor layer SM1 and the second semiconductor layer SM2 are formed of a semiconductor material and serve as an active layer of the switching thin film transistor TR1 and the driving thin film transistor TR2, respectively. Each of the first and second semiconductor layers SM1 and SM2 includes a source area SA, a drain area DA, and a channel area CA provided between the source area SA and the drain area DA. Each of the first and second semiconductor layers SM1 and SM2 may be formed of an inorganic semiconductor material or an organic semiconductor material. For instance, the first and second semiconductor layers SM1 and SM2 may include oxide semiconductor, amorphous silicon semiconductor, crystalline silicon semiconductor, or polycrystalline silicon semiconductor. The oxide semiconductor includes oxide material having at least one of indium (In), gallium (Ga), zinc (Zn), and tin (Sn). For example, the first and second semiconductor layers SM1 and SM2 may include oxide semiconductor, such as zinc oxide, tin oxide, indium oxide, indium-zinc oxide, indium-tin oxide, indium-gallium-zinc oxide, indium-zinc-tin oxide, indium-gallium-zinc-tin oxide, etc. The source area SA and the drain area DA are doped with an n-type impurity or a p-type impurity.

A gate insulating layer GI is disposed on the first and second semiconductor layers SM1 and SM2.

The first gate electrode GE1 and the second gate electrode GE2, which are connected to the gate line GL, are disposed on the gate insulating layer GI. The first gate electrode GE1 and the second gate electrode GE2 are formed to overlap with an area corresponding to the channel area CA of the first semiconductor layer SM1 and the second semiconductor layer SM2, respectively.

An inter-insulating layer IL is disposed on the first and second gate electrodes GE1 and GE2 to cover the first and second gate electrodes GE1 and GE2.

The first source electrode SE1, the first drain electrode DE1, the second source electrode SE2, and the second drain electrode DE2 are disposed on the inter-insulating layer IL. The first source electrode SE1 and the first drain electrode DE1 respectively make contact with the source area SA and the drain area DA of the first semiconductor layer SM1 through contact holes formed through the gate insulating layer GI and the inter-insulating layer IL. The second source electrode SE2 and the second drain electrode DE2 respectively make contact with the source area SA and the drain area DA of the second semiconductor layer SM2 through contact holes formed through the gate insulating layer GI and the inter-insulating layer IL.

Meanwhile, a portion of the second gate electrode GE2 and a portion of the driving voltage line DVL respectively correspond to a first capacitor electrode CE1 and a second capacitor electrode CE2 to form the capacitor Cst in cooperation with the inter-insulating layer IL disposed between the portions of the second gate electrode GE2 and the driving voltage line DVL.

Color filters CF are disposed on the first source electrode SE1, the first drain electrode DE1, the second source electrode SE2, the second drain electrode DE2, and the inter-insulating layer IL.

In one embodiment, the color filters CF are provided to correspond to the pixel areas PA in a one-to-one correspondence. The color filters CF include color filters displaying different colors from each other. For instance, the color filters CF include a first color filter, a second color filter, and a third color filter, which display different colors from each other. The first, second and third color filters respectively correspond to a blue color filter B_CF, a green color filter G_CF, and a red color filter R_CF, which respectively display blue, green, and red colors. The color filters CF may further include color filters, which display a cyan color, a magenta color, a yellow color, a white color, etc.

FIG. 3 shows the green color filter G_CF and the blue color filter B_CF respectively arranged in two pixel areas PA adjacent to each other as representative examples.

In one embodiment, a concavo-convex pattern CCP is disposed on at least a portion of an upper surface of the color filters CF. The concavo-convex pattern CCP will be described later in detail.

A passivation layer PSV is disposed on the color filters CF. The passivation layer PSV may include an inorganic material, such as silicon nitride, silicon oxide, etc.

The passivation layer PSV protects the switching and driving thin film transistors TR1 and TR2, and the passivation layer PSV serves as a planarization layer to planarize the upper surface of the color filters CF.

The first electrode EL1 is disposed on the passivation layer PSV as an anode of the light emitting device EL. The first electrode EL1 is connected to the second drain electrode DE2 of the driving thin film transistor TR2 through a contact hole formed through the passivation layer PSV. The first electrode EL1 may serve as a cathode, however, in the present exemplary embodiment, the first electrode EL1 will be described as the anode.

The first electrode EL1 may be formed of a material having a higher work function. In a case that an image shows to a lower direction of the substrate SUB, the first electrode EL1 may be formed of a transparent conductive layer, such as indium tin oxide (ITO), indium zinc oxide (IZO), zinc oxide (ZnO), indium tin zinc oxide (ITZO), etc.

A pixel definition layer PDL is disposed on the substrate SUB, on which the first electrode EL1 is formed, to partition the pixel area PA into plural areas respectively corresponding to the pixels. The pixel definition layer PDL protrudes from the substrate SUB along the circumference of the pixel to expose an upper surface of the first electrode EL1.

The light emitting layer EML is disposed in the pixel area PA surrounded by the pixel definition layer PDL, and the second electrode EL2 is disposed on the light emitting layer EML.

The light emitting layer EML emits a white light. The light emitting layer EML may be formed of various light emitting materials including a host and a dopant. As the dopant, a fluorescent dopant and a phosphorescent dopant may be used. As the host, for example, Alq3C CBP (4,4'-N,N'-dicarbazole-biphenyl), 9,10-di(naphthalen-2-yl)anthracen (ADN), or DSA (distyrylarylene), however, it should not be limited thereto or thereby.

The second electrode EL2 includes a material having a lower work function, such as metal, alloy, electric conductive compound, and a mixture thereof. For example, the second electrode EL2 includes lithium (Li), magnesium (Mg), aluminum (Al), aluminum-lithium (Al—Li), calcium (Ca), magnesium-indium (Mg—In), magnesium-silver (Mg—Ag), etc.

Meanwhile, a hole injection layer HIL and a hole transport layer HTL are provided between the first electrode EL1 and the light emitting layer EML, and an electron injection layer EIL and an electron transport layer ETL are provided between the light emitting layer EML and the second electrode EL2. When the first electrode EL1 serves as the anode, the hole injection layer HIL, the hole transport layer HTL, the light emitting layer EML, the electron transport layer ETL, the electron injection layer EIL, and the second electrode EL2 are sequentially stacked on the first electrode EL1.

A sealant layer SL is disposed on the second electrode EL2 to cover the second electrode EL2.

In the present embodiment, the OLED display having the above stated structure is manufactured by forming the color filters having the concavo-convex pattern formed on at least a portion of the upper surface thereof on the substrate, forming the passivation layer on the color filters, forming the first electrode on the passivation layer, forming the light emitting layer on the first electrode, and forming the second electrode on the light emitting layer.

The color filters may be formed by a photolithography process using a mask according to its color. In one embodiment, each color filter is formed by forming a photoresist on the substrate, on which the thin film transistor is disposed, and performing an exposure and development process on the photoresist. The concavo-convex pattern may be formed by an additional photolithography process after the color filters are formed, but it should not be limited thereto or thereby. That is, the concavo-convex pattern may be substantially and simultaneously formed together with the color filters through the same process applied to form the color filters. In this case, the concavo-convex pattern is formed on the color filters using a half-tone mask or a slit mask.

In the OLED display having the above stated structure, the light emitted from the light emitting layer is perceived by the user's eye after passing through the passivation layer, the color filters, the inter-insulating layer, the gate insulating layer, the buffer layer, and the substrate. The white light emitted from the light emitting layer is converted to a colored light while passing through the color filters.

Figure 4:
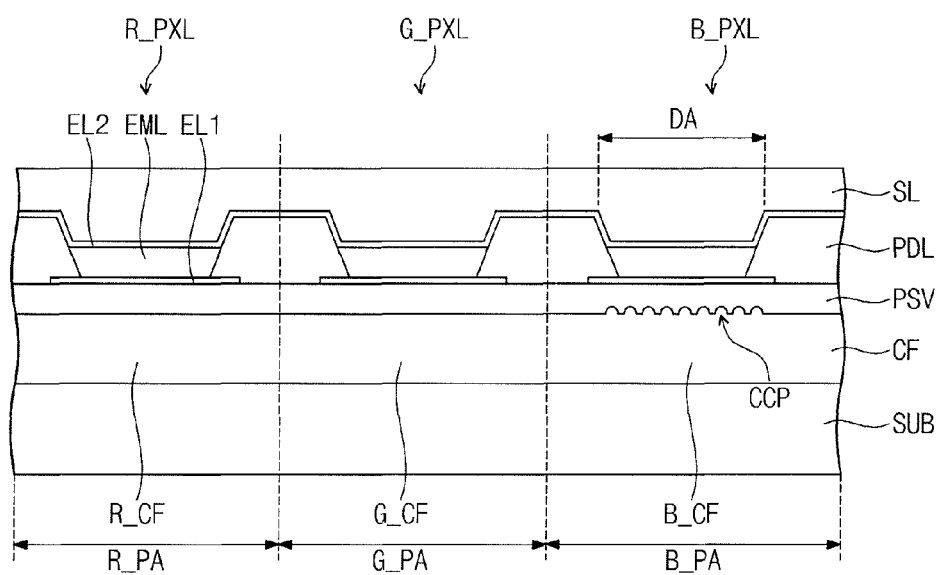
FIG. 4 is a cross-sectional view showing three adjacent pixels to each other according to an exemplary embodiment.

FIG. 4 is a cross-sectional view showing three adjacent pixels of the OLED display according to an exemplary embodiment. In FIG. 4, for the convenience of explanation, elements interposed between the substrate SUB and the color filters CF, e.g., the thin film transistor, the insulating layers, are omitted.

Referring to FIG. 4, the color filters CF are disposed on the substrate SUB. The color filters CF may display various colors, e.g., the red, green, and blue colors. Hereinafter, for the convenience of explanation, the pixel area in which the red color filter R_CF is disposed is referred to as a red pixel area R_PA, the pixel area in which the green color filter G_CF is disposed is referred to as a green pixel area G_PA, and the pixel area in which the blue color filter B_CF is disposed is referred to as a blue pixel area B_PA. In addition, pixels respectively disposed in the red pixel area R_PA, the green pixel area G_PA, and the blue pixel area B_PA are referred to as a red pixel R_PXL, a green pixel G_PXL, and a blue pixel B_PXL, respectively. The red, green, and blue color pixels R_PXL, G_PXL, and B_PXL constitute one main pixel, which is a minimum unit to display one color image.

In FIG. 4, the red pixel R_PXL, the green pixel G_PXL, and the blue pixel B_PXL are arranged adjacent to each other, however, an arrangement order of the red pixel R_PXL, the green pixel G_PXL, and the blue pixel B_PXL is not limited thereto or thereby.

Referring to FIG. 4, the red color filter R_CF, the green color filter G_CF, and the blue color filter B_CF are arranged on the substrate SUB, and the concavo-convex pattern CCP is disposed on a portion of the color filters CF, i.e., on an upper surface of the blue color filter B_CF. The concavo-convex pattern CCP protrudes from the upper surface of the blue color filter B_CF, or the concavo-convex CCP is provided in a recess recessed from the upper surface of the blue color filter B_CF.

The concavo-convex pattern CCP is used to disperse the light passing through the color filters CF and the passivation layer PSV disposed on the color filters CF to various angles. The concavo-convex pattern CCP has a hemispherical shape, a hemi-ellipsoidal shape, and a portion thereof. The concavo-convex pattern CCP is provided on the upper surface of the color filters CF in an embossed manner or in an intaglio manner.

The passivation layer PSV is disposed on the color filters CF. The passivation layer PSV is an insulating layer having a refractive index different from that of the color filters CF such that a light refraction occurs at an interface between the color filters CF and the passivation layer PSV. In a case that the passivation layer PSV has the refractive index equal to or similar to that of the color filters CF, a refractive angle of the light passing through the color filters CF and the passivation layer PSV becomes small, thereby reducing the angle of the dispersion of the light. Here, the passivation layer PSV has the refractive index greater by about 0.2 or smaller by about 0.2 than the refractive index of the color filters CF. For instance, when the color filters CF include an organic material, the refractive index of the color filters CF is equal to or greater than about 1.4 and equal to or smaller than about 1.6. In this case, the refractive index of the passivation layer PSV is equal to or smaller than about 1.2 or equal to or greater than about 1.8.

Figure 5A:
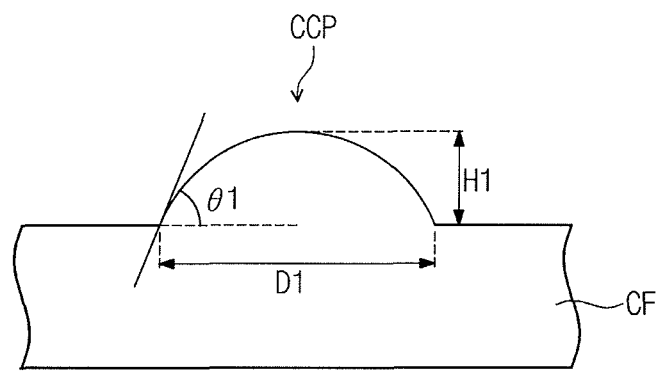
FIGS. 5A and 5B are cross-sectional views showing a concavo-convex pattern disposed on a color filter of an OLED display according to an exemplary embodiment.
Figure 5B:
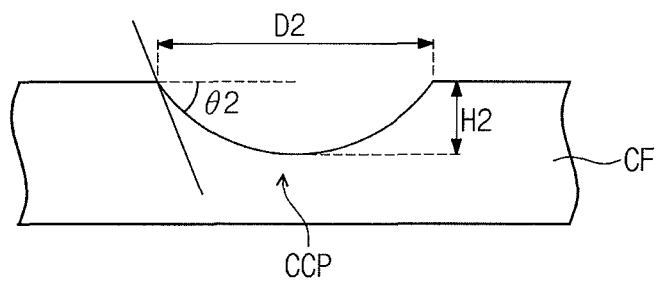

FIGS. 5A and 5B are cross-sectional views showing the concavo-convex pattern CCP disposed on the upper surface of the blue color filter B_CF. In detail, FIG. 5A shows the protrusion as the concavo-convex pattern CCP and FIG. 5B shows the recess as the concavo-convex pattern CCP. In the present embodiment, the concavo-convex pattern CCP is either the protrusion or the recess, however, it is not limited thereto or thereby. The concavo-convex pattern CCP may be configured to include the protrusion and the recess, which are alternately arranged with each other in a regular or random order. In FIGS. 5A and 5B, the concavo-convex pattern CCP has a shape corresponding to a portion of a spherical or an ellipsoidal form.

Referring to FIGS. 5A and 5B, the concavo-convex pattern CCP has a shape corresponding to the portion of the spherical or ellipsoidal form in a cross-section. Although not shown in figures, the concavo-convex pattern CCP may have a circular shape or an oval shape when viewed in a plan view.

When a diameter of the protrusion is referred to as a first diameter D1 and a height of the protrusion from the upper surface of the color filter CF is referred to as a first length H1, the shape of the protrusion may be varied in different ways by controlling a ratio of the first diameter D1 and the first length H1. Here, a contact angle $\theta 1$ between the protrusion and the upper surface of the color filter CF is changed according to the ratio of the first diameter D1 and the first length H1. A refraction direction of the light that transmits through the interface between the color filter CF and the passivation layer PSV is controlled by adjusting the first diameter D1, the first length H1, and/or the contact angle θ1, and thus, an amount of the light provided to a side surface of the substrate SUB increases.

In the same way, when a diameter of the recess is referred to as a second diameter D2 and a depth of the recess from the upper surface of the color filter CF is referred to as a second length H2, the shape of the recess may be varied in different ways by controlling a ratio of the second diameter D2 and the second length H2. Here, a contact angle θ2 between the recess and the upper surface of the color filter CF is changed according to the ratio of the second diameter D2 and the second length H2. A refraction direction of the light that transmits through the interface between the color filter CF and the passivation layer PSV is controlled by adjusting the second diameter D2, the second length H2, and/or the contact angle θ2, and thus, the amount of the light provided to the side surface of the substrate SUB increases. In the present embodiment, the contact angle is within a range from about 45 degrees to about 70 degrees.

However, the shape of the concavo-convex pattern CCP is not limited to the above-mentioned shape. The shape of the concavo-convex pattern CCP may be determined to allow the light passing through the concavo-convex pattern to travel in the various directions at the interface, and the concavo-convex pattern CCP may have an irregular interface.

In FIG. 4, the concavo-convex pattern is disposed on the upper surface of the blue color filter, but it is not limited thereto or thereby. The concavo-convex pattern may be formed on an upper surface of a color filter, which has a relatively lower lateral brightness, among the color filters. For instance, in a case that the pixels include first, second, and third color pixels displaying first, second, and third colors, the concavo-convex pattern is disposed on an upper surface of a color filter corresponding to the color pixel having the lowest lateral brightness among the first to third color pixels. Therefore, when the red pixel has the lowest lateral brightness among the red, green, and blue pixels, the concavo-convex pattern is disposed on the upper surface of the red color filter rather than the upper surface of the blue color filter.

In the present embodiment, the concavo-convex pattern includes only the protrusion. However, it is not limited thereto or thereby, and the concavo-convex pattern may include the recess only. Also, the concavo-convex pattern may include both of the protrusion and the recess, and the protrusion and/or the recess may be provided in a plural number. In the case that the protrusion and/or the recess are provided in a plural number, the protrusions or the recesses are arranged with a regular or irregular distance when viewed in a plan view.

The OLED display having the above-stated structure has a relatively high lateral brightness as compared to that of an OLED display that does not include a concavo-convex pattern, and more detailed descriptions will be described with reference to FIGS. 6 and 7.

Figure 6:
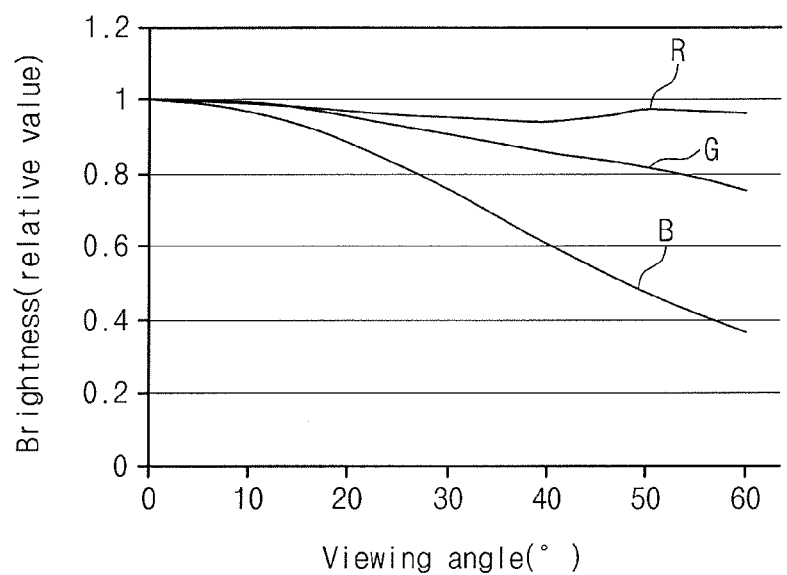
FIG. 6 is a graph showing a brightness of red, green, and blue lights according to a side viewing angle in an OLED display.

FIG. 6 is a graph showing a brightness of red, green, and blue lights according to a side viewing angle in an OLED display. The side viewing angle indicates an angle at which the user sees the image between a normal line and a surface of the substrate on the basis of the normal line of a rear surface of the substrate in the OLED display.

Referring to FIG. 6, as the side viewing angle becomes greater, the brightness decreases in all of the red light, the green light, and the blue light. In detail, the brightness in the green light decreases more than the brightness in the red light and the brightness in the blue light decreases more than the brightness in the green light as the side viewing angle becomes greater. When the side viewing angle is about 60 degrees, the brightness of the blue light is less than a half of the brightness of the red light and the green light. Thus, the color of the image becomes different in the same image depending on the side viewing angle, and the image seen by a viewer becomes yellowish as the side viewing angle becomes greater.

Figure 7:
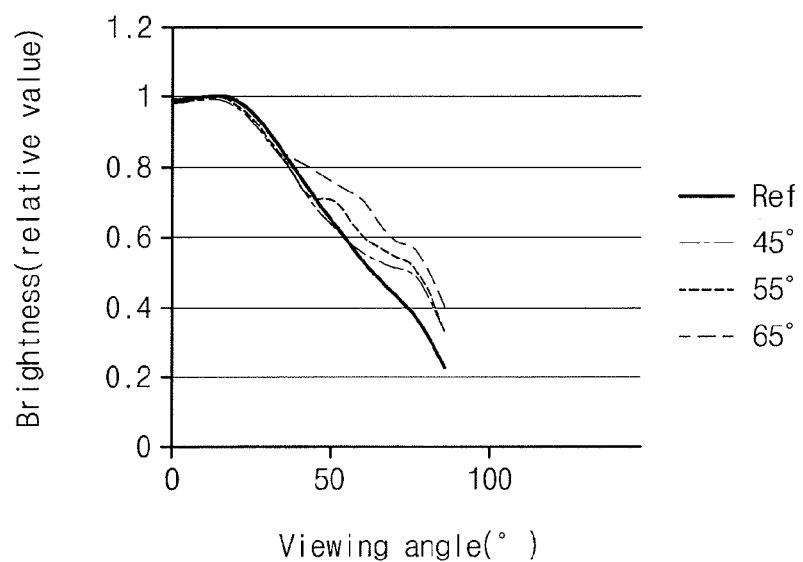
FIG. 7 is a graph showing a brightness of a blue light according to a side viewing angle in an OLED display and an OLED display according to an exemplary embodiment.

FIG. 7 is a graph showing a brightness of a blue light according to a side viewing angle in an OLED display and in an OLED display according to an exemplary embodiment. In FIG. 7, a graph indicated by "Ref." shows the brightness of the blue light according to the side viewing angle in the OLED display including a blue color filter in which no concavo-convex pattern is formed, and graphs respectively indicated by 45 degrees, 55 degrees, and 65 degrees show the brightness of the blue light according to the side viewing angle when the contact angles between the concavo-convex pattern and the upper surface of the color filter are respectively about 45 degrees, about 55 degrees, and about 65 degrees in the OLED display including the concavo-convex pattern formed on the color filter according to the present disclosure.

Referring to FIG. 7, in the OLED display including the concavo-convex pattern formed on the color filter according to the exemplary embodiment, the decrease in brightness of the blue light is smaller than the decrease in brightness of the blue light in the OLED display even though the side viewing angle becomes greater. For example, when the side viewing angle is about 60 degrees, the brightness of the blue light in the OLED display according to one embodiment increases by about 32% as compared to the brightness of the blue light in the OLED display having no concavo-convex pattern. In addition, when the side viewing angle is equal to or greater than about 65 degrees, the brightness of the blue light increases greater than about 32% as compared to that of the blue light in the OLED display that does not have a concavo-convex pattern. Further, in the OLED display according to one embodiment, as the contact angle increases, the brightness becomes greater according to the side viewing angle.

As described above, according to the present embodiment, the decrease in the brightness of the blue light becomes smaller even though the side viewing angle increases, thereby preventing a yellowish phenomenon.

Figure 8:
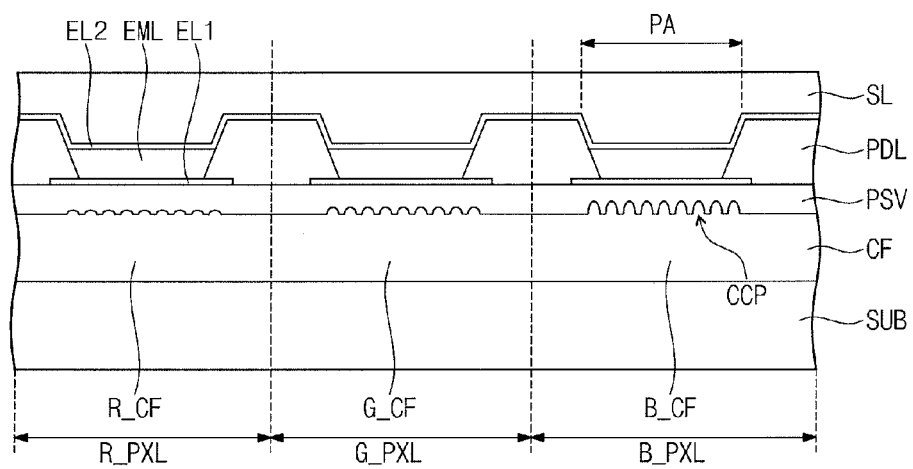
FIG. 8 is a cross-sectional view showing an OLED display according to another exemplary embodiment.

FIG. 8 is a cross-sectional view showing an OLED display according to another exemplary embodiment.

Referring to FIG. 8, a concavo-convex pattern CCP is disposed on an upper surface of color filters CF corresponding to entire pixel areas PA. That is, in the present embodiment, the concavo-convex pattern CCP is disposed not only on a blue pixel B_PXL but also on a red pixel R_PXL and a green pixel G_PXL.

The concavo-convex pattern CCP includes a protrusion and/or a recess, which has a height and/or a depth with different values depending on a decrease in brightness with respect to the side viewing angle in each pixel PXL. For instance, as shown in FIG. 6, in the case that the decrease in brightness becomes greater in an order of the red light, the green light and the blue light (red light<green light<blue light), the height and/or the depth of the concavo-convex pattern CCP on the upper surface of the blue color filter B_CF is the greatest and the height and/or the depth of the concavo-convex pattern CCP on the upper surface of the red color filter R_CF is the smallest. Here, the height of the protrusion and/or the depth of the recess may be adjusted to correspond to the decrease in brightness of the blue light, the green light, and the red light.

Figure 9:
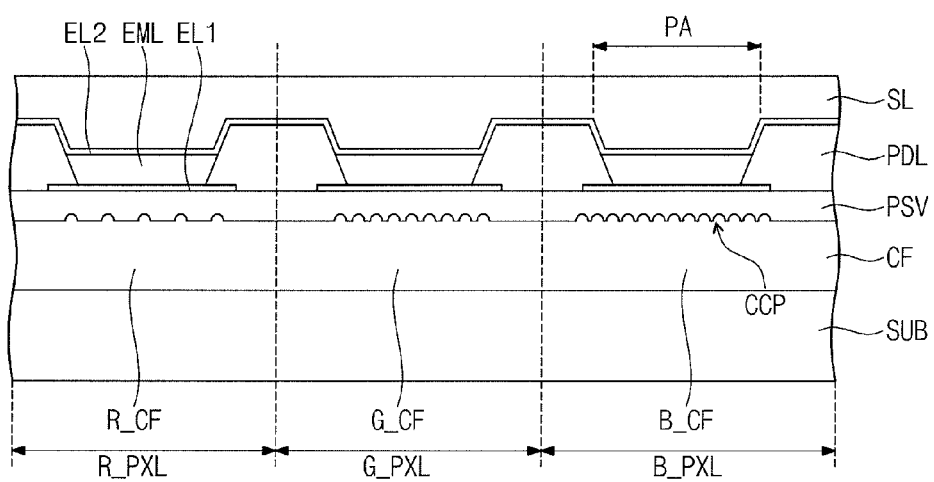
FIG. 9 is a cross-sectional view showing an OLED display according to another exemplary embodiment.

FIG. 9 is a cross-sectional view showing an OLED display according to another exemplary embodiment.

Referring to FIG. 9, a concavo-convex pattern CCP is disposed on an upper surface of the color filters CF corresponding to entire pixel areas PA, and a protrusion and/or a recess have different densities in each pixel PXL depending on a decrease in brightness according to a side viewing angle. That is, the number of protrusions and/or recesses provided in a predetermined area may be different, or an area of the protrusion and/or the recess provided in a predetermined area may be different. In FIG. 9, the number of protrusions disposed on upper surface of each color filter CF is different.

The concavo-convex pattern CCP may have the different densities depending on the decrease in brightness with respect to the side viewing angle. That is, the densities of protrusion and recess may be controlled to correspond to the decrease in brightness of the blue light, the green light, and the red light.

Although the above embodiments have been described with reference to the accompanying drawings, it is understood that the present disclosure should not be limited to these exemplary embodiments but various changes and modifications can be made by one ordinary skilled in the art within the spirit and scope of the present disclosure as hereinafter claimed.

What is claimed is:

1. An organic light emitting diode (OLED) display comprising:
    a substrate comprising a plurality of pixel areas;
    a plurality of color filters respectively formed in the pixel areas;
    a passivation layer formed on the color filters;
    a first electrode formed on the passivation layer;
    a light emitting layer formed on the first electrode; and
    a second electrode formed on the light emitting layer,
    wherein an upper surface of at least one of the color filters has a concavo-convex pattern, wherein the passivation layer includes upper and lower portions opposing each other, wherein the upper portion is farther from the substrate than the lower portion, and wherein the lower portion of the passivation layer directly contacts the upper surface of the at least one of the color filters having the concavo-convex pattern.

2. The OLED display of claim 1, wherein the color filters comprise a first color filter, a second color filter, and a third color filter, which display different colors from each other, and wherein the concavo-convex pattern is disposed on at least one of the first, second, and third color filters.

3. The OLED display of claim 2, wherein the first color filter, the second color filter, and the third color filter display a blue color, a green color, and a red color, respectively, and wherein the concavo-convex pattern comprises a protrusion or a recess.

4. The OLED display of claim 3, wherein a contact angle between an upper surface of the color filters and the protrusion or between the upper surface of the color filters and the recess is in a range of about 45 degrees to about 70 degrees.

5. The OLED display of claim 3, wherein the concavo-convex pattern is disposed on the upper surface of the first color filter.

6. The OLED display of claim 5, wherein the concavo-convex pattern is further disposed on the upper surface of each of the second color filter and the third color filter.

7. The OLED display of claim 6, wherein the height of the protrusion or the depth of the recess varies according to the red, green, and blue colors.

8. The OLED display of claim 7, wherein the height of the protrusion or the depth of the recess decreases in the order of the first color filter, the second color filter, and the third color filter.

9. The OLED display of claim 7, wherein a contact angle between an upper surface of the substrate and the protrusion decreases in the order of the first color filter, the second color filter, and the third color filter.

10. The OLED display of claim 6, wherein the protrusion or the recess is provided in a plural number, and wherein the protrusions or the recesses have a different density according to each color of the color filters.

11. The OLED display of claim 10, wherein the density decreases in the order of the first color filter, the second color filter, and the third color filter.

12. The OLED display of claim 1, wherein the color filters have a refractive index different from a refractive index of the passivation layer.

13. The OLED display of claim 12, wherein the refractive index of the color filters is equal to or greater than about 1.4, and wherein the refractive index of the passivation layer is equal to or smaller than about 1.2.

14. The OLED display of claim 12, wherein the refractive index of the color filters is equal to or smaller than 1.6 and wherein the refractive index of the passivation layer is equal to or greater than about 1.8.

15. The OLED display of claim 1, further comprising a pixel definition layer disposed on the substrate to partition a display area of the substrate, wherein the light emitting layer is disposed in the display area.

16. The OLED display of claim 1, wherein the first electrode is formed of a transparent conductive material and wherein the second electrode is formed of a metal material.

17. A method of manufacturing an organic light emitting diode (OLED) display, comprising:
    forming a plurality of color filters on a substrate, wherein an upper surface of at least one of the color filters has a concavo-convex pattern;
    forming a passivation layer on the color filters;
    forming a first electrode on the passivation layer;
    forming a light emitting layer on the first electrode; and
    forming a second electrode on the light emitting layer,
    wherein the passivation layer includes upper and lower portions opposing each other, wherein the upper portion is farther from the substrate than the lower portion, and wherein the lower portion of the passivation layer directly contacts the upper surface of the at least one of the color filters having the concavo-convex pattern.

18. The method of claim 17, wherein the color filters comprise a first color filter, a second color filter, and a third color filter, which display different colors, and wherein the concavo-convex pattern is disposed on at least one of the first, second, and third color filters.

19. The method of claim 18, wherein the forming of the color filters comprises:
    forming a photoresist on the substrate to correspond to each color;
    exposing the photoresist to a light using a half-tone mask or a slit mask; and
    developing the exposed photoresist.

20. The OLED display of claim 1, wherein the upper portion of the passivation layer facing the light emitting layer is even, and wherein the lower portion of the passivation layer has a concavo-convex pattern corresponding to the concavo-convex pattern of the at least one of the color filters.

* * * * *